(12) United States Patent
Vich

(10) Patent No.: US 7,863,527 B2
(45) Date of Patent: Jan. 4, 2011

(54) LEAD FRAME MOUNT FOR CIRCUIT COMPONENT

(75) Inventor: Gaetan Vich, Goshen, IN (US)

(73) Assignee: Continental Automotive Systems US, Inc., Auburn Hills, MI (US)

( * ) Notice: Subject to any disclaimer, the term of this patent is extended or adjusted under 35 U.S.C. 154(b) by 523 days.

(21) Appl. No.: 11/939,091

(22) Filed: Nov. 13, 2007

(65) Prior Publication Data

US 2008/0205015 A1 Aug. 28, 2008

Related U.S. Application Data

(60) Provisional application No. 60/891,381, filed on Feb. 23, 2007, provisional application No. 60/891,800, filed on Feb. 27, 2007, provisional application No. 60/942,484, filed on Jun. 7, 2007.

(51) Int. Cl.
*H01L 23/48* (2006.01)

(52) U.S. Cl. .................. 174/532; 174/527; 174/528; 174/535; 174/541; 174/551; 174/555; 439/76.2

(58) Field of Classification Search ......... 361/636–641, 361/648–650, 657, 760, 763, 765, 774, 776, 361/814; 174/50.52–50.54, 520, 527–529, 174/532, 535, 541, 545, 549, 551, 555, 563; 439/76.2
See application file for complete search history.

(56) References Cited

U.S. PATENT DOCUMENTS

| 3,602,775 | A * | 8/1971 | Baas et al. ................ 361/745 |
| 7,444,743 | B2 * | 11/2008 | Feldmeier et al. ............ 29/748 |
| 2007/0081301 | A1 * | 4/2007 | Tanaka ..................... 361/540 |
| 2007/0099448 | A1 * | 5/2007 | Taylor et al. ................ 439/73 |

* cited by examiner

*Primary Examiner*—Dameon E Levi
*Assistant Examiner*—Hoa C Nguyen

(57) ABSTRACT

An integrated circuit includes a positive lead defining a first pocket and a negative lead spaced apart from the positive lead that defines a second pocket that is aligned with the first pocket. The first and second pockets are adapted to receive and hold an electrical device such as a capacitor therein.

21 Claims, 4 Drawing Sheets

LEAD FRAME MOUNT FOR CIRCUIT COMPONENT

CROSS REFERENCE TO RELATED APPLICATION

The application claims priority to U.S. Provisional Application Nos. 60/891,381 filed on Feb. 23, 2007; 60/891,800 filed on Feb. 27, 2007; and 60/942,484 filed on Jun. 7, 2007.

BACKGROUND OF THE INVENTION

This invention generally relates to a method and device for mounting a circuit component without soldering or welding. More particularly, this application discloses a lead frame including a feature for mounting a capacitor without soldering.

A capacitor is conventionally utilized to provide electromagnetic compatibility and protection for magnetic field sensors. A conventional magnetic field sensor, such as for example a Hall Effect sensor includes an integrated circuit (IC) from which extends a positive and negative lead. A capacitor is soldered or glued directly to a lead frame at the same time the IC is attached to the lead frame. The IC and the capacitor are then overmolded at the same time.

An IC including a soldered and overmolded capacitor adds complexity and cost to the fabrication of the IC and constraints to the packaging of the IC due to the large size of the capacitor overmold and its fixed location on the lead frame. Accordingly, it is desirable to design and develop alternate less costly method of attaching a capacitor across the positive and negative leads of an integrated circuit.

SUMMARY OF THE INVENTION

An example integrated circuit includes a first lead and a second lead that each includes pockets for supporting and holding a capacitor there between.

The example integrated circuit includes a first lead and a second lead that extends from the circuit that is overmolded. The leads include fingers that form pockets into which a capacitor is mounted. The capacitor is held in place within each pocket by a light press fit. Another example integrated circuit includes first and second leads that include a U-shaped bend into which a capacitor is received. The U-shaped pocket includes a slight inward bias to provide a light press fit that holds the capacitor in place.

Accordingly, the disclosed integrated circuit includes lead frames with specific features to hold a capacitor therein and in electrical communication with both the first lead and the second lead.

These and other features of the present invention can be best understood from the following specification and drawings, the following of which is a brief description.

DETAILED DESCRIPTION OF THE PREFERRED EMBODIMENT

Figure 1:
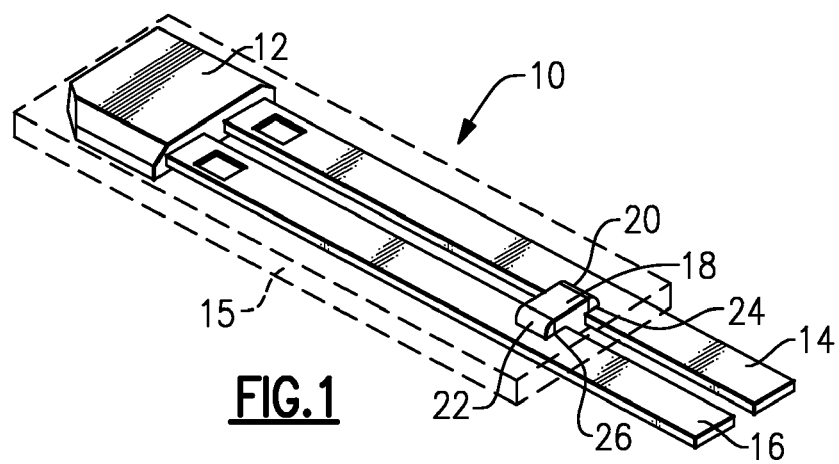
FIG. 1 is a perspective view of an example integrated circuit assembly including a capacitor held within an example pocket.

Referring to FIG. 1, an integrated circuit assembly 10 includes an integrated circuit 12 that is overmolded to protect the circuit therein. Extending from the integrated circuit 12 is a first lead 14 and a second lead 16. The first lead and the second lead 14, 16 are comprised of sheet metal material that is substantially flat. The first lead and the second lead 14, 16 include a width that is greater than the thickness. Leads 14, 16 are fabricated from an electrically conductive material that provides for the electrical communication of elements within the integrated circuit 12.

Each of the leads 14, 16 include a corresponding pocket 24, 26 that are aligned with each other for receiving a capacitor 18. The capacitor 18 extends between the leads 14, 16 to provide the desired protection from outside interference such as electromagnetic fields or other external electric fields. The capacitor 18 can then be encapsulated to protect the capacitor.

The example integrated circuit comprises a Hall Effect sensor utilized in speed sensing applications. Although the example integrated circuit 12 is a Hall effect sensor other integrated circuits that require protection from external electric and electromagnetic fields, would also benefit and are in the contemplation of this invention.

Figure 2:
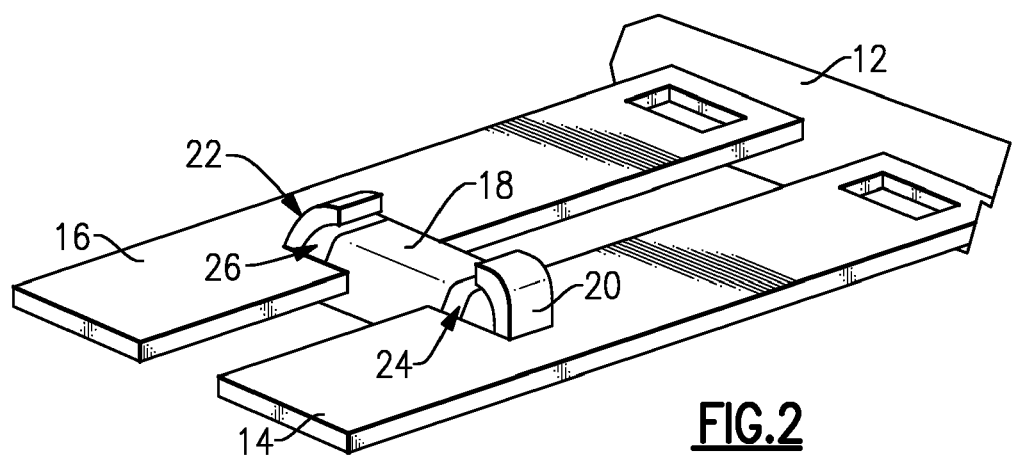
FIG. 2 is an enlarged view of the example capacitor between lead frames of the integrated circuit assembly.

Referring to FIG. 2 with continuing reference to FIG. 1, the first pocket 24 includes a first finger 20 and the second pocket 26 includes the second finger 22. Each of the fingers 20, 22 are cut portions of the corresponding lead 14, 16. The fingers 20, 22 are cut and bent transversely relative to the flat width of each of the corresponding leads 14, 16 to define the pockets 24, 26 into which the capacitor 18 is received and held.

Figure 3:
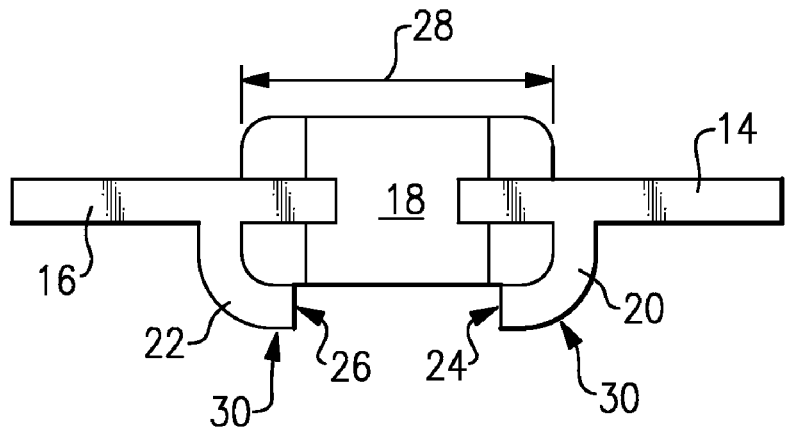
FIG. 3 is a cross-sectional view of the pocket within the first and second lead frames.
Figure 4:
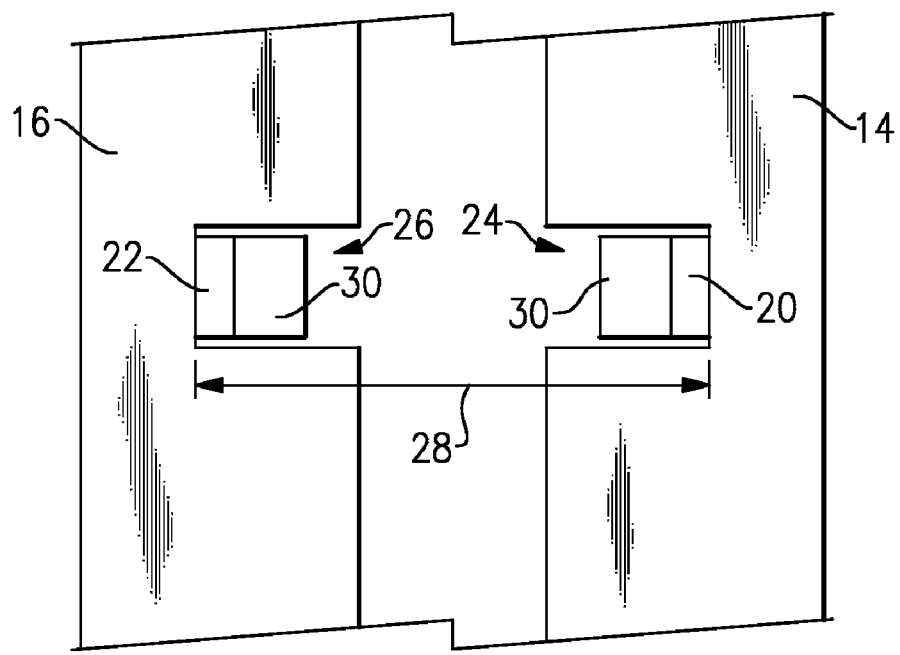
FIG. 4 is a top view of the example pocket defined within the example lead frames.

Referring to FIGS. 3 and 4, the capacitor 18 is disposed within the aligned pockets 24, 26. The fingers 20, 22 extend downward from each of the corresponding leads 14, 16. Each of the fingers 20, 22 includes a curved portion 30 that holds the capacitor 18 relative to the leads 14, 16 in the desired orientation. Each portion of the fingers 20, 22 are cut portions that are bent downwardly to extend transversely to the corresponding leads 14, 16.

A space between the fingers 20, 22 is defined by a distance 28. The distance 28 is provided such that the capacitor 18 is held in a substantially light press fit. The light press fit provides the desired electrical communication and conductivity between the capacitor 18 and each of the leads 14, 16. The distance 28 is also determined to provide as little force in a direction spreading the leads 14, 16 apart as is required to reduce undesirable stress on the encapsulated integrated circuit 12. The width of each of the pockets 24, 26 is designed to match and corresponds with the desired capacitor 18 that is to be mounted between each of the leads 14, 16.

Figure 5:
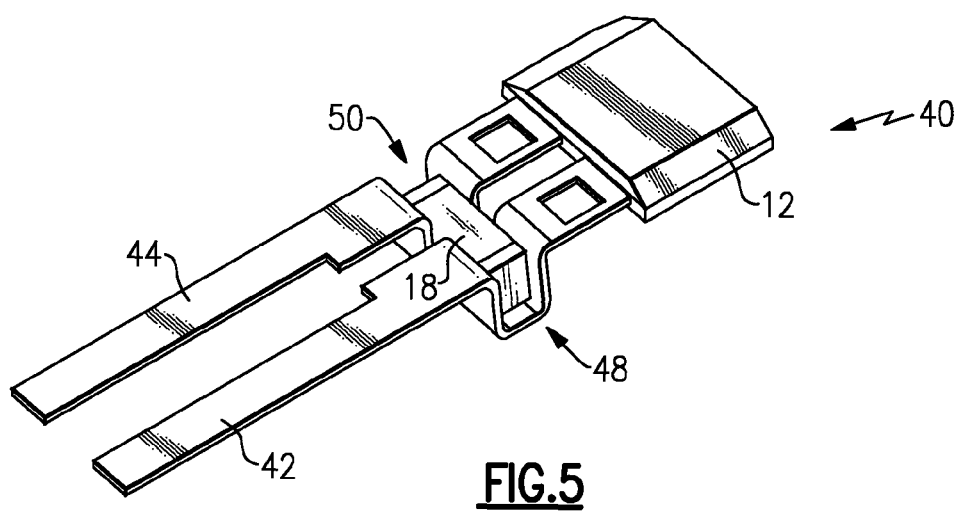
FIG. 5 is a perspective view of another example integrated circuit including a pocket defined for receiving a capacitor.
Figure 6:
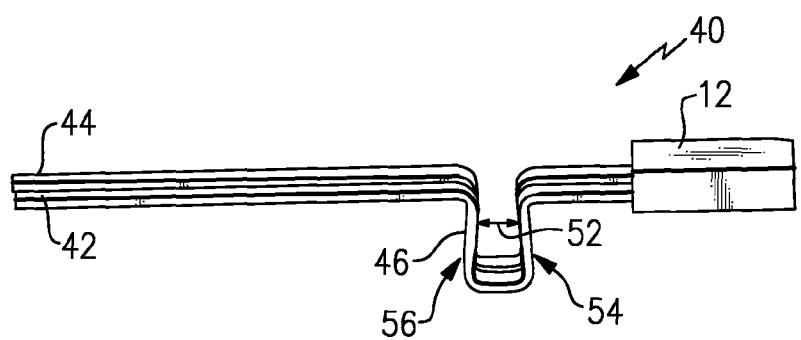
FIG. 6 is a side view of an example integrated circuit including a pocket defined for holding the example capacitor.

Referring to FIGS. 5 and 6, another example integrated circuit assembly 40 includes an encapsulated integrated circuit. Extended from the encapsulated circuit 12 are leads 42 and 44. The leads 42 and 44 each include pockets 48, 50 that are aligned with each other to receive the capacitor 18. The pockets 48, 50 are defined and formed by bending each of the corresponding leads 42, 44 to form U-shaped pockets 48, 50. The U-shaped pockets 48, 50 receive and hold the capacitor 18 between the corresponding leads 42, 44 without solder, welding or other joining processes.

Each of the U-shaped pockets 48, 50 include side walls 56, 54. The pockets 48, 50 are comprised of the U-shaped bend 46 within each of the corresponding leads 44, 42. The distance between the side walls 56, 54 tapers inwardly from a bottom part of the U-shaped bend 46. This bend spaces the side walls 56, 54 a distance 52 apart that varies in a decreasing manner from the bottom of the bend toward the top that is adjacent the leads 44, 42. The varying decreasing distance 52 at a minimum distance provides a press fit that provides the desired electrical conductivity between the capacitor and the leads 42, 44 and also provides for holding of the capacitor in place during such an overmolding operation.

Figure 7:
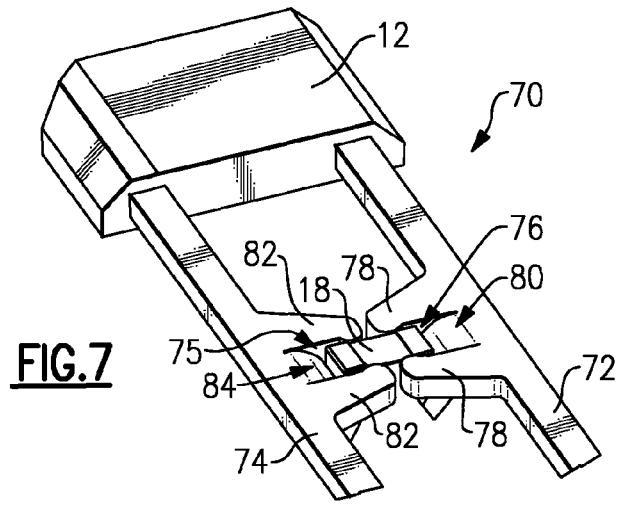
FIG. 7 is a perspective view of another example integrated circuit including a pocket for holding a capacitor.
Figure 8:
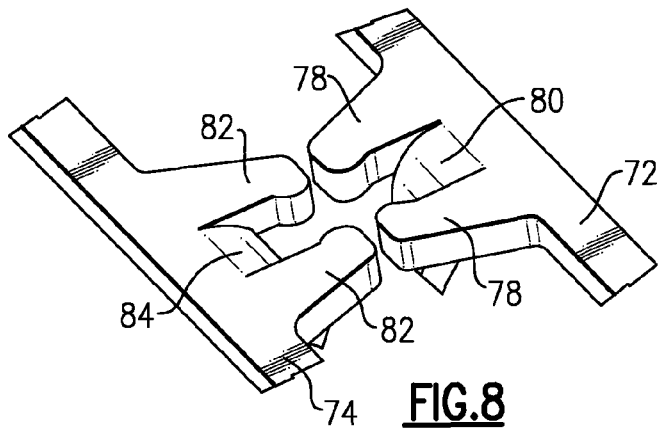
FIG. 8 is an enlarged view of the example pocket of FIG. 7.
Figure 9:
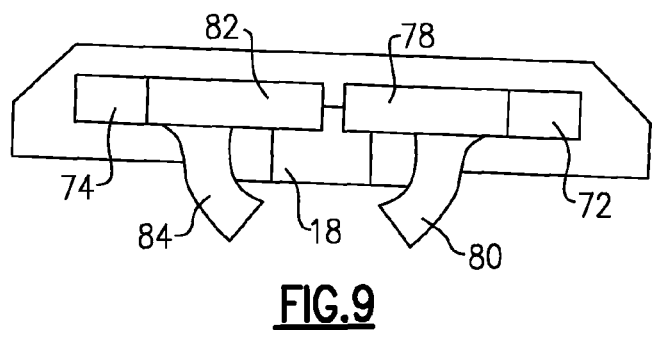
FIG. 9 is a side view of the example pocket of FIGS. 7 and 8.

Referring to FIGS. 7, 8 and 9, another integrated circuit assembly 70 includes the first lead 72 and the second lead 74. The first lead 72 includes a first pocket 76 and the second lead 74 includes a second pocket 75. The first pocket 76 includes fingers 78 that extend transversely from the first lead 72 in a direction toward the second lead 74. The second pocket 75 includes fingers 82 that extend transversely toward the first lead 72. The fingers 78 and 82 extend toward each other between the first and second leads 72 and 74. The fingers 78 and 82 are spaced apart in a longitudinal direction a distance that provides for receipt of the capacitor 18. The distance between each set of opposing fingers 78, 82 is such that a light press fit on the capacitor 18 is provided to provide the desired electrical conductivity.

Each of the pockets 75 and 76 include a corresponding first arm 84 and second arm 80. The first and second arms 80 and 84 extend transversely downward from the corresponding lead 72, 74. The arms 80 and 84 provide securement of the capacitor 18 by defining a bottom side of the pockets 75 and 76. The arms 80, 84 are transverse to the fingers 78 and 82 and include a light inwardly facing bend. The arms 80, 84 face each other and provide further securement of the capacitor 18 between the leads 72, 74. The fingers 78 and 82 along with the arms 80 and 84 are all integrally formed and are portions of the leads 72, 74. The pockets formed by the fingers 78, 82 and the arms 80 and 84 provide for securement and electrical connection without additional processes or devices.

Accordingly, the example integrated circuits include lead frames having integral features utilized for receiving and ensuring desired electrical conductivity between leads without requiring additional soldering steps or integration with the integrated circuit 12.

Although a preferred embodiment of this invention has been disclosed, a worker of ordinary skill in this art would recognize that certain modifications would come within the scope of this invention. For that reason, the following claims should be studied to determine the true scope and content of this invention.

What is claimed is:

1. An integrated circuit device comprising:
   an integrated circuit;
   a positive lead extending from the integrated circuit and including a first pocket; and
   a negative lead extending from the integrated circuit and spaced apart from the positive lead, and including a second pocket aligned with the first pocket, wherein said first pocket and said second pocket receive and hold an electrical device electrically connected in parallel with the integrated circuit.

2. The integrated circuit device as recited in claim 1, wherein the electrical device comprises a capacitor.

3. The integrated circuit device as recited in claim 1, wherein the electrical device extends from the first pocket on the positive lead into the second pocket on the negative lead.

4. The integrated circuit device as recited in claim 1, wherein the first pocket and the second pocket comprise fingers extending transverse to each of said positive and negative leads that define a space between the positive lead and the negative lead for the electrical device.

5. The integrated circuit device as recited in claim 4, wherein each of the fingers include a curved portion that curves inwardly toward each other.

6. The integrated circuit device as recited in claim 5, wherein the curved portion of each of the fingers is spaced apart from the corresponding positive and negative leads.

7. The integrated circuit device as recited in claim 1, wherein the first pocket and the second pocket comprise a bend in each of the corresponding positive and negative leads.

8. The integrated circuit device as recited in claim 7, wherein the bend includes opposing sides spaced longitudinally from each other to define a space therebetween for the electrical device.

9. The integrated circuit device as recited in claim 8, wherein the opposing sides are spaced a distance apart determined to provide an electrically conductive fit with the electrical device.

10. The integrated circuit device as recited in claim 1, wherein the first pocket and the second pocket are encapsulated with the electric device disposed therein.

11. The integrated circuit device as recited in claim 1, wherein each of the positive and negative leads comprise a substantially rectangular conductive member including a width greater than a thickness.

12. The integrated circuit device as recited in claim 1, wherein the integrated circuit comprises a Hall effect sensor.

13. A method of mounting an electrical component across leads of an integrated circuit comprising the steps of:
   a) defining a first pocket in a first lead extending from an integrated circuit by selective bending a portion of the first lead;
   b) defining a second pocket in a second lead extending from the integrated circuit by selective bending a portion of the second lead; and
   c) receiving and holding an electrical component in parallel with the integrated circuit within the first pocket and the second pocket.

14. The method as recited in claim 13, including the step of aligning the first pocket with the second pocket.

15. The method as recited in claim 13, including the step of cutting a finger from each of the first lead and the second lead and bending each the finger to extend transverse to the widest surface of each of the first lead and the second leads.

16. The method as recited in claim 15, including the step of forming a bend portion in each of the fingers transverse to the widest surface of each of the first and second leads.

17. The method as recited in claim 13, wherein the steps of selective bending a portion of the first lead and the second lead includes forming a U-shape within each of the first and second leads.

18. The method as recited in claim 17, wherein the U-shape within each of the first and second leads includes a first side and second side spaced apart from each other a desired distance.

19. The method as recited in claim 18, wherein the desired distance provides an electrically conductive interface with the electrical component.

20. The method as recited in claim 13, including the step of encapsulating the electrical component and a portion of the first lead and the second lead.

21. The method as recited in claim 13, wherein the integrated circuit comprises a Hall effect sensor.

\* \* \* \* \*